United States Patent
Tamatsuka et al.

(10) Patent No.: US 6,299,982 B1
(45) Date of Patent: Oct. 9, 2001

(54) SILICON SINGLE CRYSTAL WAFER AND METHOD FOR PRODUCING SILICON SINGLE CRYSTAL WAFER

(75) Inventors: Masaro Tamatsuka; Akihiro Kimura; Katsuhiko Miki; Makoto Iida, all of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/313,856

(22) Filed: May 18, 1999

(30) Foreign Application Priority Data

Jun. 3, 1998 (JP) .................................................. 10-170629

(51) Int. Cl.$^7$ .................................................. C03B 15/29
(52) U.S. Cl. ........................... 428/446; 428/698; 117/12; 117/13
(58) Field of Search ........................ 117/13, 12; 428/446, 428/704, 698

(56) References Cited

U.S. PATENT DOCUMENTS

| | | | |
|---|---|---|---|
| 4,851,358 | * | 7/1989 | Huber ..................... 357/526 |
| 5,096,839 | * | 3/1992 | Amai et al. .............. 148/33.2 |
| 5,667,584 | * | 9/1997 | Takano et al. ................ 117/13 |
| 5,919,302 | * | 7/1999 | Falster et al. .................. 117/3 |
| 5,935,320 | * | 8/1999 | Graef et al. ................... 117/2 |
| 6,071,337 | * | 6/2000 | Sakurada et al. ............. 117/13 |
| 6,139,625 | * | 10/2000 | Tamatsuka et al. ........... 117/19 |

FOREIGN PATENT DOCUMENTS

| | | | |
|---|---|---|---|
| 0170788A1 | 2/1986 | (EP) | .............................. C30B/15/04 |
| 0747513A2 | 12/1996 | (EP) | .............................. C30B/15/00 |
| 0747513A3 | 5/1997 | (EP) | .............................. C30B/15/00 |
| 0829559A1 | 3/1998 | (EP) | .............................. C30B/13/28 |
| 60-251190 | 12/1985 | (JP) | .............................. C30B/15/04 |
| 60251190 | 12/1985 | (JP) | .............................. C30B/15/04 |
| 2-267195 | 10/1990 | (JP) | .............................. C30B/29/06 |
| 4-192345 | 7/1992 | (JP) | .............................. H01L/21/66 |

OTHER PUBLICATIONS

Abe, Takao and Hiroshi Takeno, "Dynamic Behavior of Intrinsic Point Defects in FZ and CZ Silicon Crystals," Mat. Res. Soc. Symp. Proc. vol. 262, 1992 Materials Research Society, pp. 3–13.

Shimura, F. and R. S. Hockett, "Nitrogen Effect on Oxygen Precipitation in Czochralski Silicon," Appl. Phys. Lett. 48(3), Jan. 20, 1986, pp. 224–226.

Shimura, et al., "Nitrogen Effect on Oxygen Precipitation in Czochralski Silicon," Applied Physics Letters, (1986) Jan., No. 3, pp. 224–226.

* cited by examiner

*Primary Examiner*—Archene Turner
(74) *Attorney, Agent, or Firm*—Hogan & Hartson, L.L.P.

(57) ABSTRACT

There is disclosed a silicon single crystal wafer produced by processing a silicon single crystal ingot grown by Czochralski method with doping nitrogen, wherein a size of grown-in defects in the silicon single crystal wafer is 70 nm or less, a silicon single crystal wafer produced by processing a silicon single crystal ingot grown by Czochralski method with doping nitrogen, the silicon single crystal ingot is grown with controlling a rate of cooling from 1150 to 1080° C. to be 2.3° C./min or more, and a method for producing a silicon single crystal wafer wherein a silicon single crystal ingot is grown with doping nitrogen and controlling a rate of cooling from 1150 to 1080° C. to be 2.3° C./min or more, and is then processed to provide a silicon single crystal wafer. The silicon single crystal wafer for device wherein growth of the crystal defects is suppressed can be produced by CZ method in high productivity.

20 Claims, 4 Drawing Sheets

DISTANCE FROM SHOULDER PART OF CRYSTAL INGOT (cm)

DISTANCE FROM SHOULDER PART OF CRYSTAL INGOT (cm)

US 6,299,982 B1

SILICON SINGLE CRYSTAL WAFER AND METHOD FOR PRODUCING SILICON SINGLE CRYSTAL WAFER

BACKGROUND OF THE INVENTION

1. Field of the Invention

The present invention relates to a silicon single crystal wafer wherein a size of crystal defect inside the crystal, called grown-in defect, is decreased to the smallest by doping nitrogen and optimizing a cooling rate, a nitrogen concentration and an oxygen concentration when pulling a silicon single crystal by a Czochralski method (hereinafter referred to as "CZ method"), and a method for producing it.

2. Description of the Related Art

As a wafer for fabrication of a device such as a semiconductor integrated circuit, a silicon single crystal wafer grown by a Czochralski method (CZ method) is mainly used. If crystal defects are present in such a silicon single crystal wafer, pattern failure is caused when a semiconductor device is fabricated. Particularly, the pattern width of devices which is highly integrated in recent years is very fine as 0.3 $\mu$m or less. Accordingly, even small crystal defects as 0.1 $\mu$m may cause defects such as pattern failures in the device, and may remarkably lower a yield and characteristics of the device. Accordingly, a size of the crystal defects in the silicon single crystal wafer have to be decreased as thoroughly as possible.

Recently, it has been reported that the above-mentioned crystal defects called grown-in defect incorporated during growth of the crystal are found in the silicon single crystal grown by CZ method by various measurement methods. For example, these crystal defects in a single crystal grown at a general growth rate in commercial production (for example, about 1 mm/min or more) can be detected as a pit by subjecting the surface of the crystal to preferential etching (Secco etching) with Secco solution (a mixture of $K_2Cr_2O_7$, hydrofluoric acid and water) (See Japanese Patent Application Laid-open (kokai) No.4-192345).

The main cause of generation of such a pit is considered to be a cluster of vacancies which are aggregated during manufacture of single crystal or an oxide precipitate which is an agglomerate of oxygen atoms getting in from a quartz crucible. When these crystal defects are present in the surface portion (at a depth of 0 to 5 $\mu$m) in which a device is fabricated, they come to harmful defect to degrade characteristics of the device.

Accordingly, it is desirable to reduce these crystal defects.

For example, it is known that a concentration of the above-mentioned cluster of vacancies can be lowered by decreasing a growth rate of the crystal extremely (for example, to 0.4 mm/min or less) (See Japanese Patent Application Laid-open (kokai) No.2-267195). However, adopting this method, there is generated a crystal defect which is considered to be a dislocation loop formed as a result of new aggregation of excess interstitial silicon atoms, which may degrade characteristics of a device significantly. Accordingly, the problem cannot be solved by the method. Furthermore, productivity of the single crystal and cost performance are extremely decreased in the method, since the growth rate of the crystal is decreased from about 1.0 mm/min as usual or more to 0.4 mm/min or less.

SUMMARY OF THE INVENTION

The present invention has been accomplished to solve the above-mentioned problems, and the prime object of the present invention is to provide in high productivity by CZ method a silicon single crystal wafer for a device wherein formation of crystal defects is suppressed.

To achieve the above object, the present invention provides a silicon single crystal wafer produced by processing a silicon single crystal ingot grown by Czochralski method with doping nitrogen, characterized in that a size of grown-in defects in the silicon single crystal wafer is 70 nm or less.

As described above, when the silicon single crystal wafer is produced by processing a silicon single crystal ingot grown by Czochralski method with doping nitrogen, the size of Grown-in defect in the wafer can be reduced to 70 nm or less. Since such a fine crystal defect hardly gives a harmful influence on fabrication of the device, the silicon single crystal wafer can be improved yield and quality of device.

Preferably, in the silicon single crystal wafer produced by processing a silicon single crystal ingot grown by Czochralski method with doping nitrogen, the silicon single crystal ingot is grown with controlling a rate of cooling from 1150 to 1080° C. to be 2.3° C./min or more.

As described above, in the silicon single crystal wafer produced by processing a silicon single crystal ingot grown by CZ method with doping nitrogen, grown-in defects present on the wafer is very few due to presence of doped nitrogen. When the crystal ingot is grown with controlling the rate of cooling from 1150° C. to 1080° C. at 2.3° C./min or more, the size of the crystal defects can be extremely decreased to have almost no harmful influence on fabrication of the device. Furthermore, since growth of crystal defects can be suppressed, it is possible to grow crystal at high speed, so that productivity can also be improved.

In the above case, the nitrogen concentration in the above-mentioned silicon single crystal wafer is preferably in the range of 0.2 to $5 \times 10^{15}$ atoms/cm$^3$.

In order to suppress growth of crystal defect, the nitrogen concentration is preferably $1 \times 10^{10}$ atoms/cm$^3$ or more. In order not to prevent crystallization of single crystal, the nitrogen concentration is preferably $5 \times 10^{15}$ atoms/cm$^3$ or less. However, the nitrogen concentration in the range of 0.2 to $5 \times 10^{15}$ atoms/cm$^3$ is the most effective for suppression of growth of crystal defects, and therefore growth of crystal defects can be sufficiently suppressed when the nitrogen concentration is in the range.

During growth of the silicon single crystal ingot by Czochralski method with doping nitrogen, a concentration of oxygen in the single crystal ingot is preferably controlled to be $1.0 \times 10^{18}$ atoms/cm$^3$ (ASTM '79 value) or less. When the oxygen concentration is low as above, growth of the crystal defects can be further suppressed, and formation of oxide precipitates in the surface layer can be prevented.

A silicon single crystal wafer as described above has very few crystal defects on the surface. Particularly, since the density of the crystal defects can be decreased to 40 number/cm$^2$ or less, yield can be improved significantly in fabrication of the device so that productivity of the crystal can be significantly improved.

The present invention also provides a method for producing a silicon single crystal wafer wherein a silicon single crystal ingot is grown with doping nitrogen and controlling a rate of cooling from 1150 to 1080° C. to be 2.3° C./min or more, and is then processed to provide a silicon single crystal wafer.

As described above, in CZ method for growing a silicon single crystal ingot, growth of crystal defects incorporated during growth of crystal can be suppressed by doping nitrogen. Furthermore, since growth of crystal defects can be suppressed by growing crystal with controlling a rate of cooling from 1150 to 1080° C. to be 2.3° C./min or more, crystal defects become very fine. Since growth of the crystal defects can be significantly suppressed, crystal can be grown at high speed, so that productivity of the crystal can be significantly improved.

The nitrogen concentration doped in the single crystal ingot is preferably 0.2 to $5\times10^{15}$ atoms/cm$^3$. The concentration of oxygen in the single crystal ingot is preferably $1.0\times10^{18}$ atoms/cm$^3$ or less.

As described above, when cooling is performed at high speed and the concentration of doped nitrogen and the concentration of oxygen are controlled to be in the optimum range in production of silicon single crystal by CZ method with doping nitrogen, the silicon single crystal wafer having high quality and few crystal defects can be produced in high productivity.

In the silicon single crystal wafer produced by processing a silicon single crystal ingot grown by Czochralski method with doping nitrogen, a size of grown-in defects in the silicon single crystal wafer can be 70 nm or less, and thus yield and quality of the device can be improved.

According to a method for producing a silicon single crystal wafer of the present invention, a silicon single crystal ingot is grown with doping nitrogen and with controlling a rate of cooling from 1150 to 1080° C. to be 2.3° C./min or more, and is then processed to provide a silicon single crystal wafer. Therefore, it is possible to suppress growth of the crystal defects in the silicon single crystal produced by CZ method, and to produce the silicon single crystal wafer wherein crystal defects detected in the surface layer of the wafer are very small, and the number of crystal defects are very small, easily and in high productivity.

DESCRIPTION OF THE INVENTION AND EMBODIMENT

Figure 1:
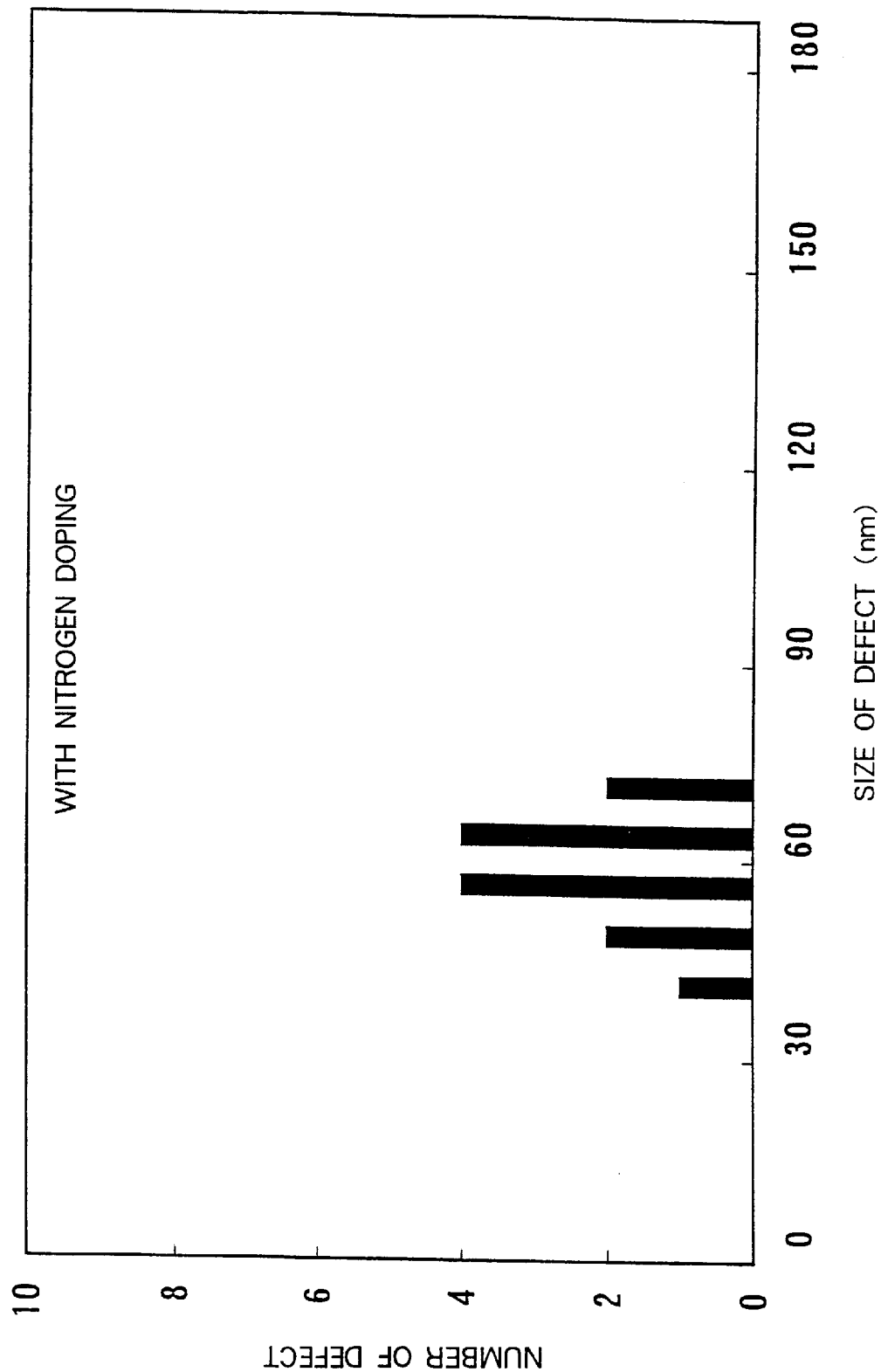
FIG. 1 is a graph showing a relation between a size of grown-in defect and the number of defects having the size in the silicon single crystal wafer in which nitrogen is doped.

The present invention will now be described in more detail. However, the invention is not limited thereto.

The inventors have found that the size of crystal defects significantly depends on a rate of cooling crystal from 1150 to 1080° C. as a crystal producing condition in addition to doping of nitrogen during growth of silicon single crystal by CZ method, and that there can be obtained a silicon single crystal wafer wherein the crystal defects in a device fabricating layer (the surface layer of the wafer) are fine enough to cause no matter as a result of suppression of growth of crystal defects due to aggregation or the like, by controlling the rate of cooling to be high as 2.3° C./min or more, and have accomplished the present invention by studying the conditions.

Namely, it is reported that agglomeration of vacancies in the silicon is suppressed when nitrogen is doped in a silicon single crystal so that density of a crystal defect is decreased (T. Abe and H. Takeno, Mat. Res. Soc. Symp. Proc. Vol. 262, 3, 1992). It is considered that the effect can be achieved with a result that vacancy agglomeration process is transited from homogenous nuclei formation to heterogeneous nuclei formation. Accordingly, the silicon single crystal having very small crystal defect can be obtained by growing a silicon single crystal by CZ method with doping nitrogen, and thus the silicon single crystal wafer having very small crystal defect can be obtained by processing it. According to the method, it is not always necessary to decrease growth rate of crystal, not as in the conventional method, and thus a silicon single crystal wafer having low defects density can be produced in high productivity.

Furthermore, the size of crystal defects significantly depends on time of passing in aggregation temperature range of vacancies. It is known that the aggregation temperature range of vacancies is 1150 to 1080° C., and thus it can be predicted that the size of crystal defects can be decreased by shortening the time of passing in the temperature range when the crystal is grown. Accordingly, in the present invention, the crystal is grown with controlling a rate of cooling from 1150° C. to 1080° C., which is the range of aggregation temperature, to be 2.3° C./min or more, preferably 3.5° C./min or more. It is thereby possible to shortening time of passing in an aggregation temperature range, so that the size of crystal defects can be decreased to be fine so as to cause no matter in fabrication of a device.

The reason why growth of crystal defect generated in silicon can be suppressed by doping nitrogen in silicon single crystal is, as described above, considered to be that vacancy agglomeration process is transited from homogenous nuclei formation to heterogeneous nuclei formation.

Accordingly, the concentration of doped nitrogen is preferably $1\times10^{10}$ atoms/cm$^3$ or more, at which heterogeneous nuclei formation can be caused sufficiently. When it is more than $5\times10^{15}$ atoms/cm$^3$, which is solid solubility of nitrogen in silicon single crystal, crystallization of single crystal is inhibited. Therefore, it is preferably not more than the concentration.

Furthermore, the inventors of the present invention have further studied the concentration of nitrogen, and found that the most effective nitrogen concentration is in the range of 0.2 to $5.0\times10^{15}$ atoms/cm$^3$. When the concentration of doped nitrogen is relatively high as the above range, the highest effect of suppressing formation of crystal defects by doping nitrogen can be achieved, and formation of large crystal defect which may cause problem can be prevented almost completely.

On the other hand, it is known that a nitrogen atom in a silicon single crystal accelerates oxygen precipitation during the growth of the crystal (for example, in F. Shimura and R. S. Hockett, Appl. Phys. Lett. 48, 224, 1986). Accordingly, when the single crystal having general concentration of oxygen ($1\times10^{18}$ atoms/cm$^3$ or more) is used, it may form oxide precipitate which is harmful to the device forming layer existing near the surface of the processed wafer. Accordingly, the inventors of the present invention solved the problem by doping nitrogen in CZ silicon single crystal having a concentration of oxygen of $1.0 \times 10^{18}$ atoms/cm³ (ASTM'79) or less which is lower than general value.

In the conventional CZ silicon single crystal having low concentration of oxygen as above, there may be a problem that the strength of the crystal is lowered. However, since nitrogen is doped in the single crystal according to the present invention at a concentration, for example, of 0.2 to $5 \times 10^{15}$ atoms/cm³, sufficient strength of the crystal can be obtained due to presence of nitrogen, as previously indicated (for example, K. Sumino, I. Yonenaga, and M. Imai, J. Appl. Phys. 54, 5016, 1983).

In the present invention, a silicon single crystal ingot in which nitrogen is doped can be grown by CZ method according to the known method such as disclosed in, for example, Japanese Patent Application Laid-open (kokai) No 60-251190.

Namely, in CZ method comprising contacting a seed crystal with a melt of polycrystalline silicon raw material contained in a quartz crucible, pulling it with rotating to grow a silicon single crystal ingot having an intended diameter, nitrogen can be doped in a silicon single crystal by placing nitride previously in the quartz crucible, adding nitride into the silicon melt, or by using an atmosphere gas containing nitrogen. A doping amount in the crystal can be controlled by controlling an amount of nitride, concentration or time of introduction of nitrogen gas. For example, nitrogen concentration can be easily controlled in the above-mentioned range of 0.2 to $5.0 \times 10^{15}$ atoms/cm³.

As described above, growth of crystal defect introduced during growth of crystal can be suppressed by doping nitrogen while a single crystal ingot is grown by CZ method. Furthermore, it is not necessary to reduce a growth rate of crystal to, for example, 0.4 mm/min or less for suppression of formation of crystal defect, and therefore the productivity of crystal can be improved significantly.

As described above, it is important to grow the crystal at a high rate of cooling from 1150 to 1080° C. as 2.3° C./min or more. In order to actually fulfil such a condition, there can be provided an apparatus for cooling the crystal in any rate of cooling from 1150° C. to 1080° C. in a chamber of an apparatus for producing a silicon single crystal by CZ method. Such an apparatus may be an apparatus which cools crystal by spraying a cooling gas thereto, or a water cooled ring which is provided so as to surround a crystal at a predetermined position above the melt. In this case, the cooling rate can be controlled in a desired range by controlling the pulling rate of the crystal.

As described above, it is preferable that oxygen concentration in the single crystal ingot is $1.0 \times 10^{18}$ atoms/cm³ or less, when the silicon single crystal ingot is grown by CZ method with doping nitrogen.

Oxygen concentration can be lowered so as to fall in the above range by a conventional method, when a silicon single crystal ingot is grown. For example, oxygen concentration can be easily controlled to fall in the above mentioned range by reducing the number of rotation of a crucible, increasing gas volume of flowing, lowering an atmosphere pressure, controlling temperature distribution and convection of a silicon melt or the like.

The silicon single crystal ingot wherein nitrogen is doped in a desirable concentration, oxygen is contained in a desirable concentration and crystal is grown at desirable rate of cooling in CZ method can be thus obtained. After it is sliced with a slicing apparatus such as an inner diameter blade slicer, a wire saw or the like, it is subjected to processes such as chamfering, lapping, etching, polishing or the like to be a silicon single crystal wafer. Of course, such processes are merely examples, and other processes such as cleaning or the like can be conducted, and process can be changed appropriately depending on the purpose, namely, order of processes can be changed, and some processes can be omitted.

As mentioned above, there is produced the silicon single crystal wafer of the present invention which was obtained by processing the silicon single crystal ingot grown by Czochralski method with doping nitrogen and with controlling a rate of cooling from 1150 to 1080° C. to be 2.3° C./min or more.

In such a silicon single crystal wafer, crystal defects in the surface layer are very few, particularly 40 number/cm² or less. Especially, it is possible to almost completely eliminate surface crystal defects which may cause a problem in a device process, so that yield of the device can be significantly improved.

EXAMPLES

The following examples and comparative examples are being submitted to further explain the present invention. These examples are not intended to limit the scope of the present invention.

Example, Comparative Example

In accordance with CZ method, 40 kg of polycrystalline material of silicon was charged into a quartz crucible having a diameter of 18 inches, six single crystal ingots of silicon having a diameter of 6 inches P conductive type and orientation <100> were pulled, at a pulling rate of 1.2 mm/min as usual value.

Five of them were pulled while silicon wafer having silicon nitride film is previously charged into the silicon melt so that nitrogen concentration in the crystal of 0.2 to $5.0 \times 10^{15}$ atom/cm³ can be achieved. The number of rotation of the crucible was controlled so that the low concentration of oxygen in the single crystal of 0.8 to $1.0 \times 10^{18}$ atoms/cm³ can be achieved. Each of the single crystal ingot was pulled with controlling a rate of cooling from 1150 to 1080° C. through use of a cooling apparatus provided in a chamber of a CZ method silicon single crystal growing apparatus to be 1.2, 1.6, 2.3, 3.0, 3.5° C./min.

Another crystal ingot was pulled without doping nitrogen in accordance with a conventional method. The crystal ingot was pulled with controlling a rate of cooling from 1150 to 1080° C. to be 2.3° C./min. The concentration of oxygen in the single crystal was controlled to be $0.8 \times 10^{18}$ atoms/cm³.

The wafers were sliced with a wire saw from the single crystal ingot thus obtained, and subjected to chamfering, lapping, etching, and mirror polishing. Then, silicon single crystal mirror polished wafer having a diameter of 6 inches were produced in almost the same condition except that nitrogen is doped or not, the cooling rate and the concentration of oxygen.

Figure 2:
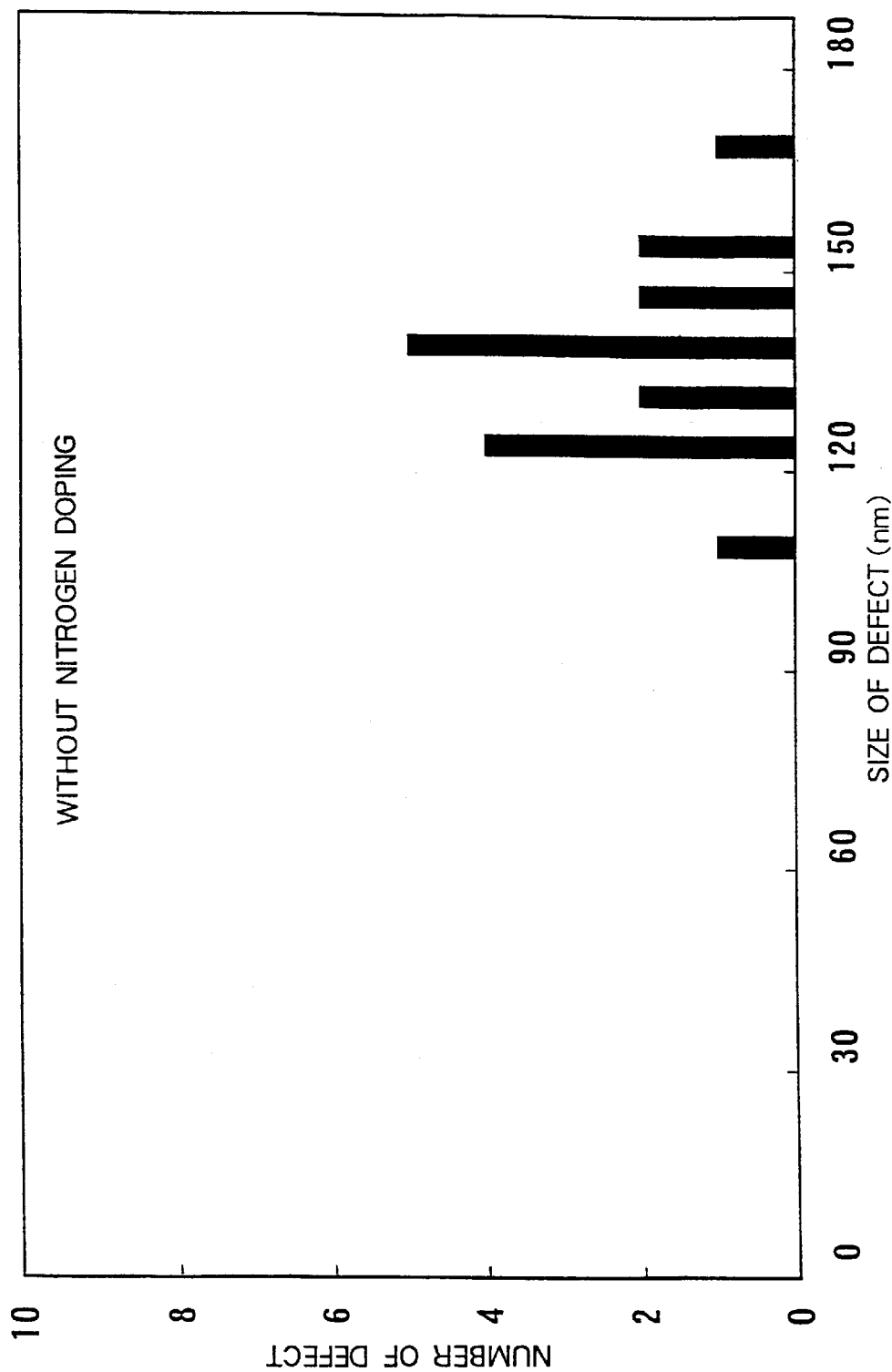
FIG. 2 is a graph showing a relation between a size of grown-in defect and the number of defects having the size in the silicon single crystal wafer in which nitrogen is not doped.

Measurement and comparison were performed through use of LST (Laser Scattering Tomography) as for the size of grown-in defect in the two resulting wafers one of which has the doped nitrogen concentration of 0.2 to $5.0 \times 10^{15}$ atoms/cm³ and the other has no doped nitrogen, and both of which were produced with a rate of cooling of 2.3° C./min. The results were shown in FIG. 1 and FIG. 2. As shown in FIG. 1 and FIG. 2, among the resulting wafers obtained from the crystals having the same oxygen concentration of $0.8 \times 10^{18}$ atoms/cm³, each of which was produced at a relatively high cooling rate as 2.3° C./min, a size of a grown-in defect on the wafer obtained from the crystal without doping of nitrogen was about 140 nm (FIG. 2), while a size of a grown-in defect on the wafer obtained from the crystal with doped nitrogen was about 60 nm (FIG. 1). It is apparent that the latter is less than half of the former as a result of suppression of growth of defects.

The silicon single crystal wafer thus obtained was subjected to Secco etching, pit density was measured by observing the surface thereof with a microscope to determine a density of crystal defects (grown-in defects). The measurement was performed at a center portion, at a distance of a half of radius from the center, and at a peripheral portion of the wafers which were sliced from each of the single crystal ingots at a position of 10, 20, 30, 40, 50 or 60 cm from the shoulder part thereof.

Figure 3:
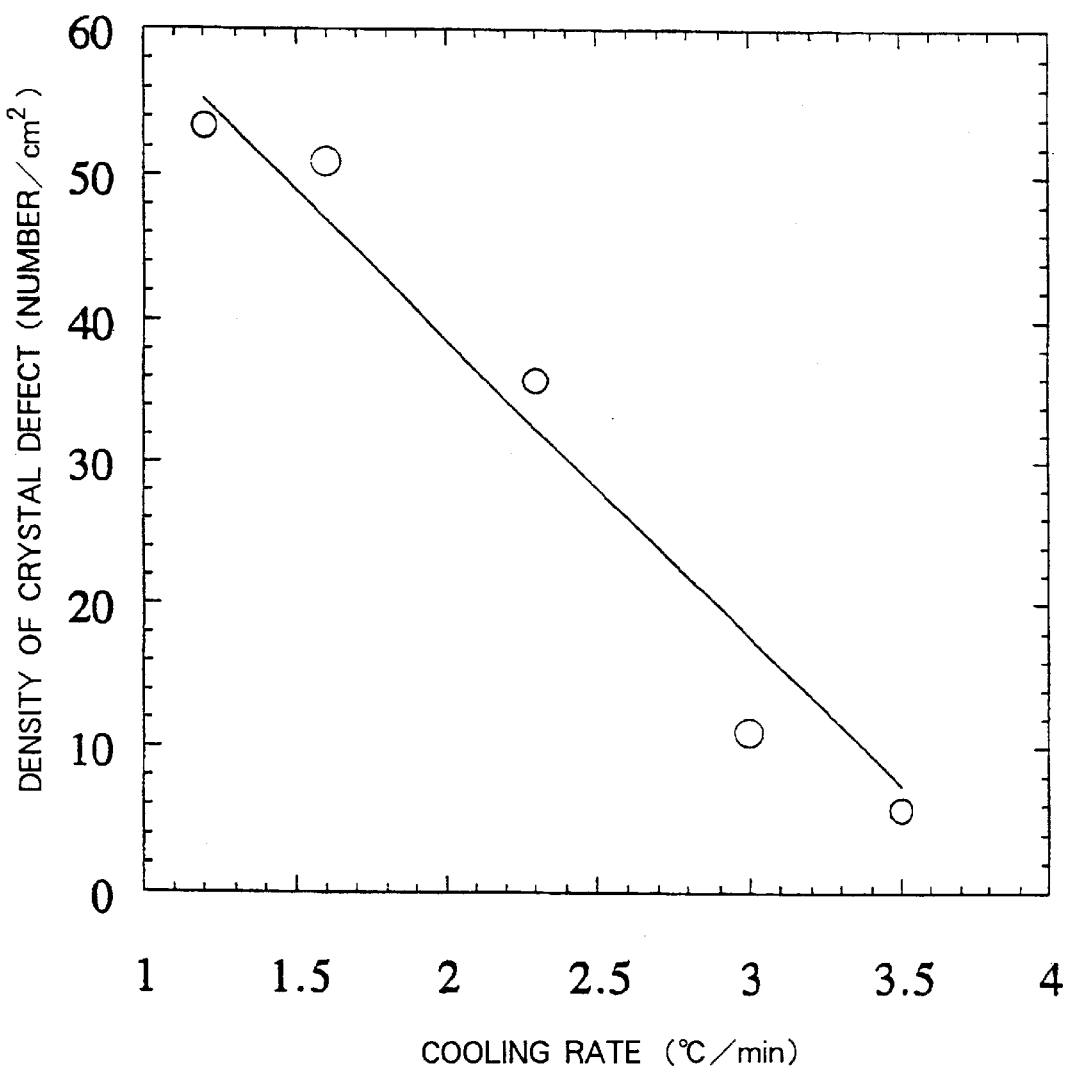
FIG. 3 is a graph showing a relation between an average value of crystal defect density of the silicon single crystal wafer sliced from the five silicon single crystal ingots in which nitrogen is doped and a rate of cooling.
Figure 4:
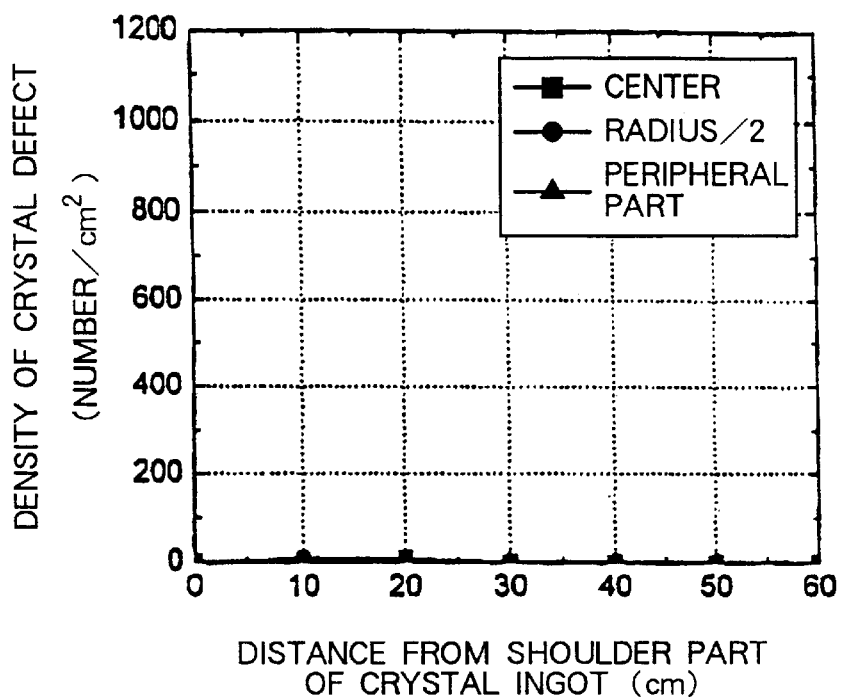
FIG.4 is a graph showing the defect density of the silicon single crystal wafer obtained from the ingot grown with doping nitrogen and with controlling a rate of cooling to be 2.3° C./min.
Figure 5:
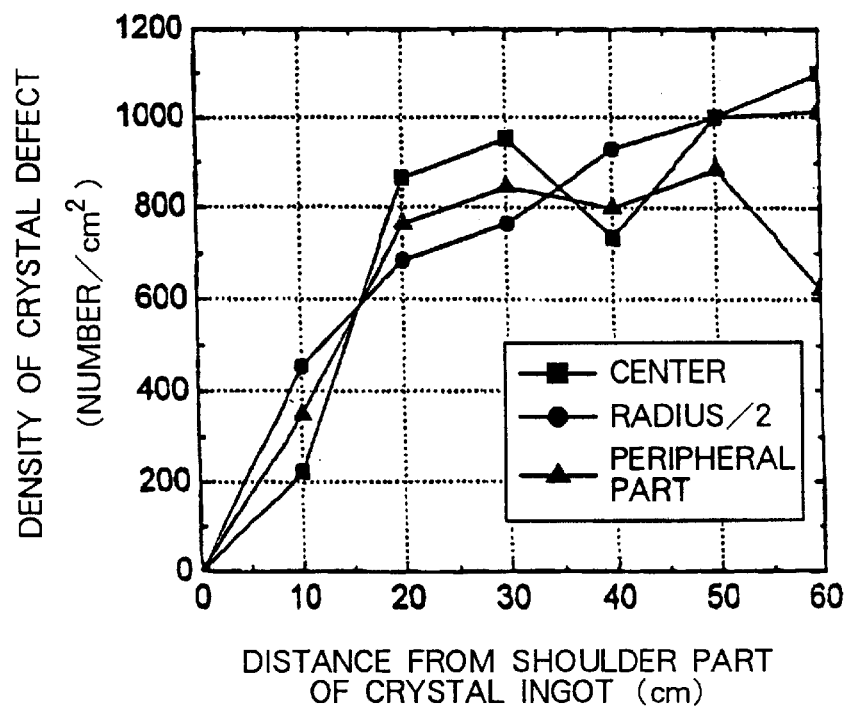
FIG. 5 is a graph showing the defect density of the silicon single crystal wafer obtained from the ingot grown without doping nitrogen.

The results were shown in FIG. 3 to FIG. 5. FIG. 3 is a graph showing a relation between an average value of crystal defect density of the silicon single crystal wafer sliced from the five silicon single crystal ingots in which nitrogen is doped and a rate of cooling. FIG. 4 is a graph showing the defect density of the silicon single crystal wafer obtained from the ingot grown with doping nitrogen and with controlling a rate of cooling to be 2.3° C./min. FIG. 5 is a graph showing the defect density of the silicon single crystal wafer obtained from the conventional ingot grown without doping nitrogen. In each of the figures, square plots represent the data at the center of the wafer, circle plots represent the data at a distance of half of radius from the center of the wafer, triangle plots represent the data at peripheral part of the wafer.

As shown in FIG. 3, as the cooling rate increases, the density of defect decreases. Therefore, it is apparent that the preferable cooling rate is 2.3° C./min or more, especially, 3.5° C./min or more. The reason for this can be considered that aggregation of the defect is suppressed at such a high cooling rate, and thus a size thereof decrease to be fine.

As shown in FIG. 4, in production of the silicon single crystal wafer of the present invention, the pulling rate was 1.0 mm/min or more which was the same as or higher than that in a conventional method, nevertheless, the density of the crystal defects of all of the wafers sliced from the same crystal ingot was extremely decreased all over the wafer, to almost zero, in comparison with the wafer obtained by the conventional method. Namely, according to the present invention, there can be surely provided a silicon single crystal wafer having a density of crystal defects of 40 number/cm$^2$ or less on the surface of the wafer.

As shown in FIG. 5, in the conventional silicon single crystal wafer, the density of the crystal defects tends to be higher in the wafer sliced from the farther part from the shoulder portion of the single crystal ingot. Particularly, the density of the crystal defects is 600 number/cm$^2$ or more in the wafer sliced from the ingot at 20 cm far from the shoulder portion of the single crystal ingot.

The present invention is not limited to the above-described embodiment. The above-described embodiment is a mere example, and those having the substantially same structure as that described in the appended claims and providing the similar action and effects are included in the scope of the present invention.

For example, the method of the present invention can be applied not only for a Czochralski method but also for any type of MCZ method (Magnetic field applied Czochralski crystal growth method) in which magnetic field is applied when the silicon single crystal is pulled. Namely, the term "a Czochralski method" includes not only general Czochralski method but also MCZ method.

What is claimed is:

1. A silicon single crystal wafer produced by processing a silicon single crystal ingot grown by Czochralski method with doping nitrogen, wherein a size of grown-in defects in the silicon single crystal wafer is 70 nm or less.

2. The silicon single crystal wafer according to claim 1 wherein the nitrogen concentration in said silicon single crystal wafer is in the range of 0.2 to $5 \times 10^{15}$ atoms/cm$^3$.

3. The silicon single crystal wafer according to claim 2 wherein the density of the crystal defects on the surface of the wafer is 40 number/cm$^3$ or less.

4. The silicon single crystal wafer according to claim 2 wherein oxygen concentration in the single crystal wafer is $1.0 \times 10^{18}$ atoms/cm$^3$ or less.

5. The silicon single crystal wafer according to claim 4 wherein the density of the crystal defects on the surface of the wafer is 40 number/cm$^3$ or less.

6. The silicon single crystal wafer according to claim 1 wherein oxygen concentration in the single crystal wafer is $1.0 \times 10^{18}$ atoms/cm$^3$ or less.

7. The silicon single crystal wafer according to claim 6 wherein the density of the crystal defects on the surface of the wafer is 40 number/cm$^3$ or less.

8. The silicon single crystal wafer according to claim 1 wherein the density of the crystal defects on the surface of the wafer is 40 number/cm$^3$ or less.

9. A silicon single crystal wafer produced by processing a silicon single crystal ingot grown by Czochralski method with doping nitrogen, wherein the silicon single crystal ingot is grown with controlling a rate of cooling from 1150 to 1080° C. to be 2.3° C./min or more.

10. The silicon single crystal wafer according to claim 9 wherein the density of the crystal defects on the surface of the wafer is 40 number/cm$^3$ or less.

11. The silicon single crystal wafer according to claim 9 wherein the nitrogen concentration in said silicon single crystal wafer is in the range of 0.2 to $5 \times 10^{15}$ atoms/cm$^3$.

12. The silicon single crystal wafer according to claim 11 wherein oxygen concentration in the single crystal wafer is $1.0 \times 10^{18}$ atoms/cm$^3$ or less.

13. The silicon single crystal wafer according to claim 12 wherein the density of the crystal defects on the surface of the wafer is 40 number/cm$^3$ or less.

14. The silicon single crystal wafer according to claim 9 wherein oxygen concentration in the single crystal wafer is $1.0 \times 10^{18}$ atoms/cm$^3$ or less.

15. The silicon single crystal wafer according to claim 14 wherein the density of the crystal defects on the surface of the wafer is 40 number/cm$^3$ or less.

16. The silicon single crystal wafer according to claim 9 wherein the density of the crystal defects on the surface of the wafer is 40 number/cm$^3$ or less.

17. A method for producing a silicon single crystal wafer wherein a silicon single crystal ingot is grown with doping nitrogen and controlling a rate of cooling from 1150 to 1080° C. to be 2.3° C./min or more, and is then processed to provide a silicon single crystal wafer.

18. The method for producing a silicon single crystal wafer according to claim 17 wherein oxygen concentration in the single crystal ingot is $1.0 \times 10^{18}$ atoms/cm$^3$ of less, when growing silicon single crystal ingot by Czochralski method with doping nitrogen.

19. The method for producing a silicon single crystal wafer according to claim 17 wherein the nitrogen concentration doped in the single crystal ingot is 0.2 to $5 \times 10^{15}$ atmos/cm$^3$, when growing silicon single crystal ingot by Czochralski method with doping nitrogen.

20. The method for producing a silicon single crystal wafer according to claim 19 wherein oxygen concentration in the single crystal ingot is $1.0 \times 10^{18}$ atoms/cm$^3$ or less, when growing silicon single crystal ingot by Czochralski method with doping nitrogen.

* * * * *